United States Patent [19]
Sutardja et al.

[11] Patent Number: 6,011,437
[45] Date of Patent: Jan. 4, 2000

[54] HIGH PRECISION, HIGH BANDWIDTH VARIABLE GAIN AMPLIFIER AND METHOD

[75] Inventors: Pantas Sutardja, San Jose; Gani Jusuf, San Carlos, both of Calif.

[73] Assignee: Marvell Technology Group, Ltd., Hamilton HM, Bermuda

[21] Appl. No.: 09/072,729

[22] Filed: May 4, 1998

[51] Int. Cl.[7] ...................................................... H03F 3/45
[52] U.S. Cl. ............................................ 330/254; 330/133
[58] Field of Search ................................... 330/254, 253, 330/279, 129, 133

[56] References Cited

U.S. PATENT DOCUMENTS

| H965 | 9/1991 | Davis et al. | 330/254 |
|---|---|---|---|
| 4,213,097 | 7/1980 | Chiu et al. | 330/279 |
| 4,554,511 | 11/1985 | Braun | 330/129 |
| 5,198,780 | 3/1993 | Kase | 330/254 |
| 5,216,384 | 6/1993 | Vanhecke | 330/133 |
| 5,313,172 | 5/1994 | Vagher | 330/254 |
| 5,371,475 | 12/1994 | Brown | 330/254 |
| 5,642,077 | 6/1997 | Nagaraj | 330/253 |

Primary Examiner—Robert Pascal
Assistant Examiner—Khanh Van Nguyen
Attorney, Agent, or Firm—Fenwick & West LLP

[57] ABSTRACT

A variable gain amplifier includes a differentially-connected pair of NFETs for receiving differential input voltage signals. The source-drain channel of each NFET is coupled to a respective PFET operating in linear mode as a variable load resistance in a $g_m \times R$ gain stage, the gain of which is determined by a gain-controlling signal applied to the gates of the PFETs. For broad dynamic range of voltage amplification, the drain of each NFET is coupled to a respective current source that is referenced to a supply voltage having a higher voltage level than the supply voltage for biasing the PFETs. Multiple stages of such variable gain stages are cascaded and independently gain controlled in successive stages to yield substantially exponential variation in overall gain as individual gain stages are adjusted. A control circuit controls the gains of each stage for obtaining a desired total overall gain for the multi-stage amplifier. Improved overall gain-bandwidth performance driving a heavy output load at high gain is achieved by increasing the voltage gain of an output stage from lowest gain last in succession in a procedure for adjusting the overall total voltage gain of the multi-stage amplifier.

10 Claims, 3 Drawing Sheets

HIGH PRECISION, HIGH BANDWIDTH VARIABLE GAIN AMPLIFIER AND METHOD

FIELD OF THE INVENTION

The present invention is related to circuits and methods of generating variable voltage gain amplification of an input signal, and more particularly, to circuits and methods for precisely controlling voltage gain over a broad bandwidth of an input signal even at high voltage gain levels and in the presence of heavy output loads.

BACKGROUND OF THE INVENTION

Certain known variable voltage gain amplifiers include operational amplifiers of both single stage and multi-stage designs. These conventional circuits often suffer from such performance limitations as limited dynamic range, distortion in the presence of heavy output loads, and tradeoffs between the level of voltage gain available and the bandwidth over which the amplifier provides a substantially flat voltage gain profile.

Referring now to FIG. 1a there is shown a schematic of a conventional single-stage variable gain amplifier 100. The amplifier includes a pair of n-type, field effect transistors (NFETs) 3, 4 connected to receive a pair of differential input signals for generating a pair of differential output signals 7,10 as amplified versions of the input signals. Each output signal 7,10 is produced across a p-type, field effect transistor (PFET) 5, 6 that provides an effective variable resistance in response to applied gain-controlling signal 9, for controlling the voltage gain provided by the amplifier.

In such conventional amplifiers, the level of voltage gain provided by the amplifier is substantially inversely proportional to the bandwidth of the amplifier. Further, if the amplifier is used to drive a heavy load at high gain, the amplifier may distort the output signals. The dynamic range provided by the amplifier is limited by the voltage differential across the drain and source of each respective PFET 5, 6. More particularly, the limit on output voltage swings is substantially limited to $I_{PFET} \times R_{eff}$ for each output voltage signal 7,10, where $I_{PFET}$ is the current from source to drain in each PFET 5, 6 and is dependent on the voltage level of the supply voltage 8 and the current level of the current source 17.

Referring now to FIG. 1b, there is shown a conventional multi-stage variable gain amplifier 101 including a plurality of cascaded single-stage amplifiers 20, 21, 22, 23 of a type such as shown in FIG. 1a, for amplifying applied differential input voltage signals 18, 19 in successive stages. Amplification of voltage signals in successively cascaded stages typically improves the bandwidth of the amplifier at various levels of voltage gain. However, because each of the single-stage, variable-gain amplifiers 21–23 is coupled to the same voltage gain control line 25, the voltage gain provided by the output stage amplifier 23 is increased as the voltage gain of the entire multi-stage amplifier 101 is increased, thereby reducing the ability of the output stage amplifier 23 to drive heavy output loads at high voltage gain and wide bandwidth.

SUMMARY OF THE INVENTION

The variable gain amplifier of the present invention operates over wide bandwidth with broad dynamic range of amplification factors for operation, for example, in a read channel of a magnetic data storage device. A magnetic transducer may constitute a source of differential input signal to be selectively amplified to a corresponding differential output signal. The voltage gain of the entire amplifier is controllable by selectively adjusting effective load resistances of individual gain stages.

Each gain stage of the amplifier includes a pair of gain elements such as NFETs that are connected as differential input elements with source-drain channels connected in common to a current source. Each such input element is connected to a variable load resistance and to an independent current source for driving the amplified output signal in the presence of heavy output loads. By suitably adjusting the variable load resistance in response to an applied control voltage, the gain stage is able to operate over a broad dynamic range of amplification with wide bandwidth.

For wideband amplification, the present invention includes a plurality of such gain stages that are cascaded to form a multi-stage amplifier, and also includes a control circuit for individually controlling the voltage gain of each such gain stage to provide a selected overall level of voltage gain on applied differential input signals. To improve the ability of the multi-stage amplifier to drive heavy output loads at high gain levels without distortion, the control circuit adjusts the voltage gain of each gain stage in succession. Thus, the gain of the initial or input gain stage is selectively adjusted from a minimum level to its maximum level while the successive cascaded stages operate at minimum gain. If additional voltage gain is desired, then the gain of a second cascaded gain stage is also increased, while the gain of the remaining cascaded gain stages operate at minimum gain, and so on until all gain stages are adjusted to operate at maximum gain, if required.

DETAILED DESCRIPTION OF THE INVENTION

Figure 1A:
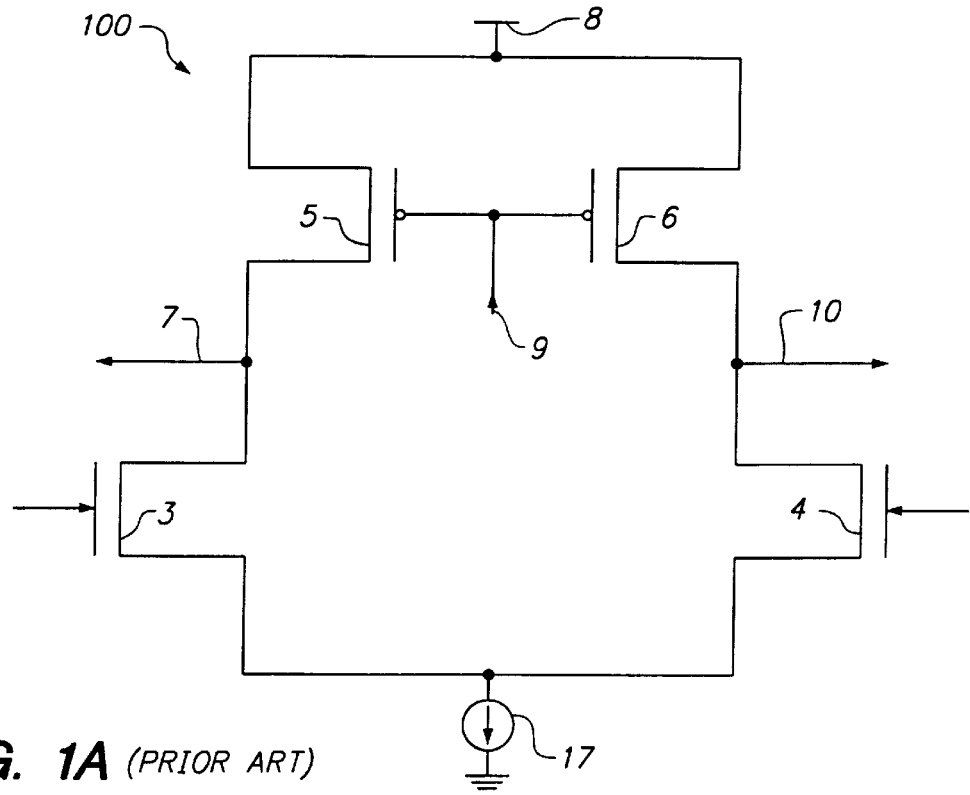
FIG. 1a is a block schematic diagram of a conventional single stage, variable-gain amplifier for amplifying a pair of differential voltage input signals.
Figure 2A:
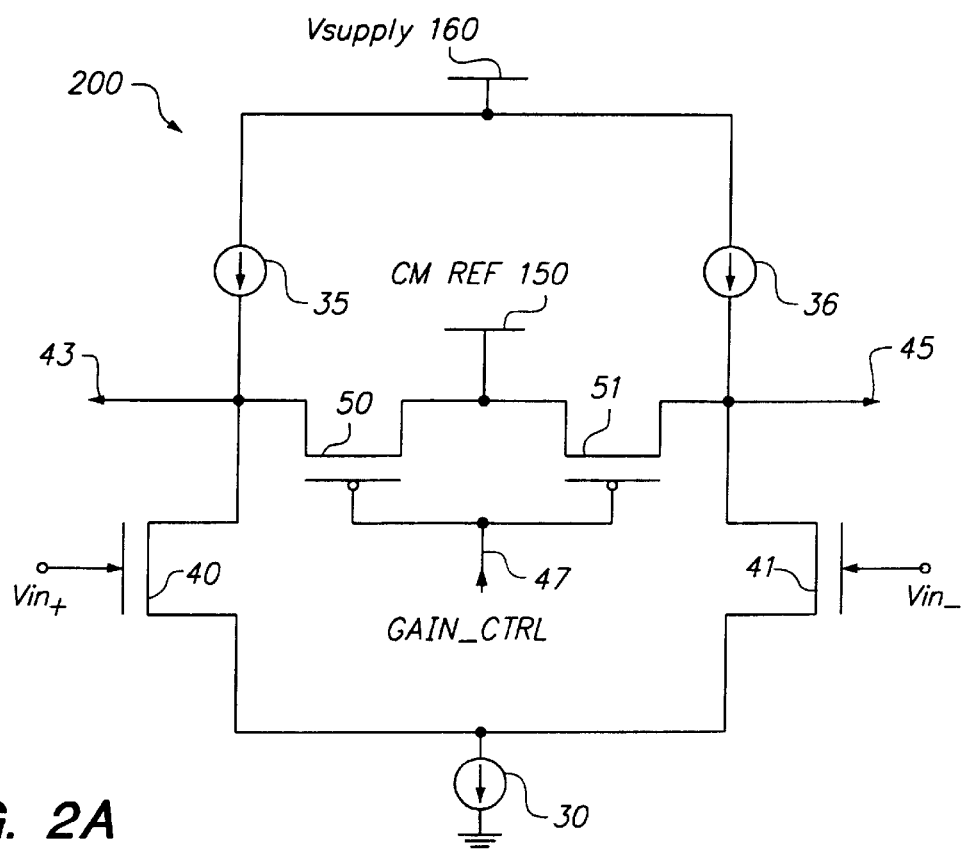
FIG. 2a is a block schematic diagram of a variable gain amplifier in accordance with one embodiment of the present invention for amplifying a differential pair of input signals by a selectable level of gain.
Figure 1B:
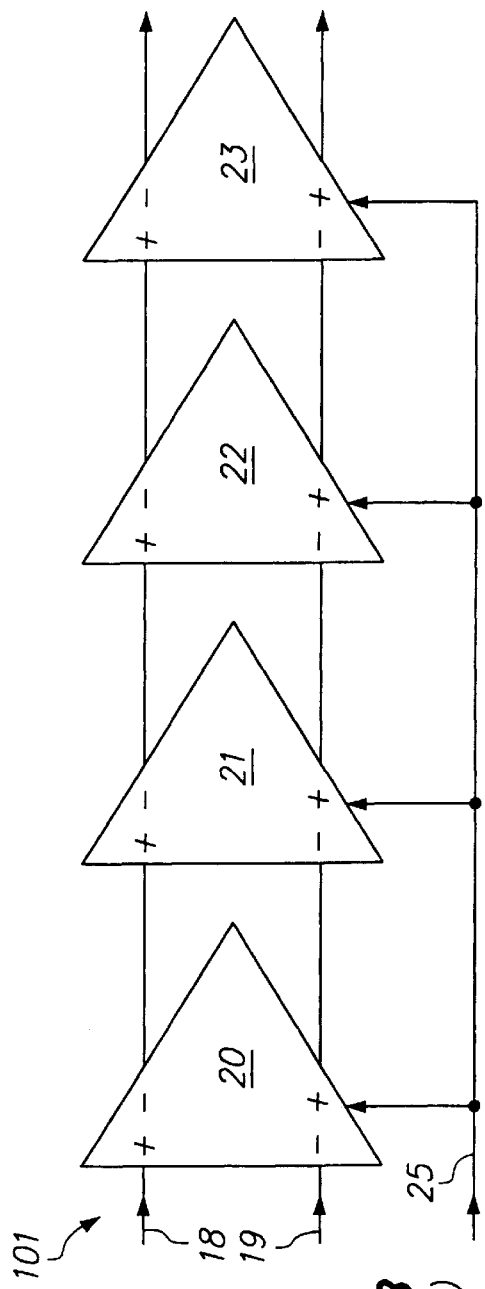
FIG. 1b is a block schematic diagram of a conventional multi-stage, variable-gain amplifier for amplifying a pair of differential voltage input signals.

Referring now to FIG. 2a, there is shown a schematic of a single-stage, variable-gain amplifier constructed in accordance with the present invention. Differential input voltage signals are applied to the gates of two NFETs 40, 41 that have sources commonly connected through current source 30 to ground. Each NFET 40, 41 includes a variable load resistor in the form of a PFET 50, 51 connected to the drain of each NFET 40,41 for generating differentially amplified output voltage signals 43,45 at the drains of the two NFETs 40, 41.

The drain of each NFET 40, 41 is coupled to the drain of a respective one of two PFETs 50, 51, with the source of each of the PFETs 50, 51 being coupled to a common-mode reference voltage source CMREF 150 at a higher voltage level than ground. This CMREF voltage effectively sets the common mode output voltage 43, 45 of the gain stage 200. Each of the PFETs 50, 51 provides an effective variable resistance $R_{eff}$ from drain to source for controlling the voltage gain provided by the NFET 40, 41 to which it is coupled, with the magnitude of the effective resistance controlled by a control signal, GAIN_CTRL 47 applied in common to the gates of the PFETs 50, 51. The PFETs 50, 51 may be biased to operate in linear regions, and the NFETs 40, 41 may be biased to operate in the saturation region.

The voltage gain provided by each NFETs 40, 41 may be determined as the transconductances $g_m$ of the NFET 40, 41 times the magnitude of the effective resistance $R_{eff}$ of the associated PFET 50, 51. For example, in embodiments of the present invention where the transconductances are substantially equal and the effective resistances are substantially equal, the voltage gain on applied small differential voltage signals is approximately given by:

$$\text{gain} = -g_m \times R_{eff} \quad \text{(Eq. 1)}$$

To improve dynamic range of signal amplification without distortion due to clipping of the amplified output voltage at the voltage level of the reference voltage 150, current sources 35, 36 are connected to supply current from the supply voltage 160 to the drain of a respective NFET 40, 41 where the supply voltage $V_{supply}$ 160 has a higher voltage than the common-mode reference voltage source 150. Thus, the common mode reference source 150 sets the common-mode output level and also establishes that the NFETs 40, 41 operate in saturation. The current from sources 35 and 36 are substantially equal and their sum is equal to the current in current source 30.

The NFET 40, 41 coupled to respective current sources 35, 36 thus operate as transconductance stages and the PFETs 50, 51 operate as effective resistances for controlling the voltage gain of the stage according to Equation 1 by controlling the effective resistance of the PFETs 50, 51 in response to the applied gain controlling signal 47. Minimum gain may be attained by setting the gain controlling signal 47 to reference voltage #1 such as ground, or zero (or other referencing potential for the current source 30), and the highest gain settings may be attained by setting the gain controlling signal 47 to a higher voltage value of reference voltage #2. All gain settings of a gain stage 200 are therefore determined by applying to the associated port 47 a gain setting voltage having a value between reference voltage #1 and reference voltage #2.

Figure 2B:
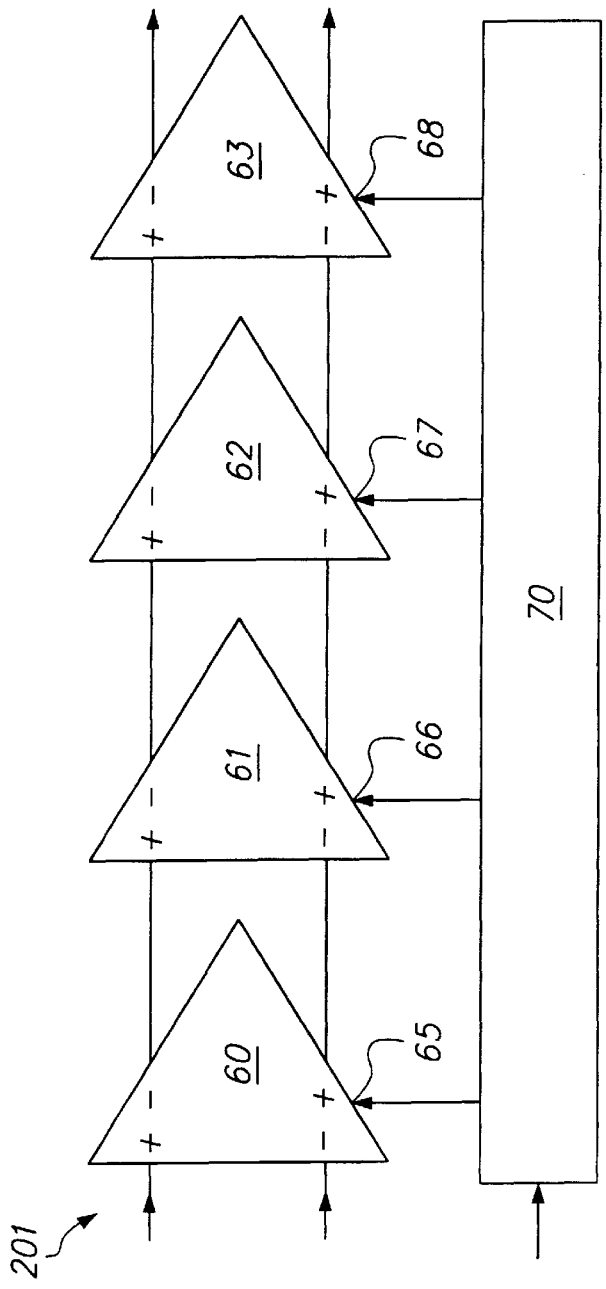
FIG. 2b is a block schematic diagram of a multi-stage variable gain amplifier in accordance with another embodiment of the present invention for amplifying a differential pair of input signals by a level of overall gain that is controlled selectively per stage.
Figure 3:
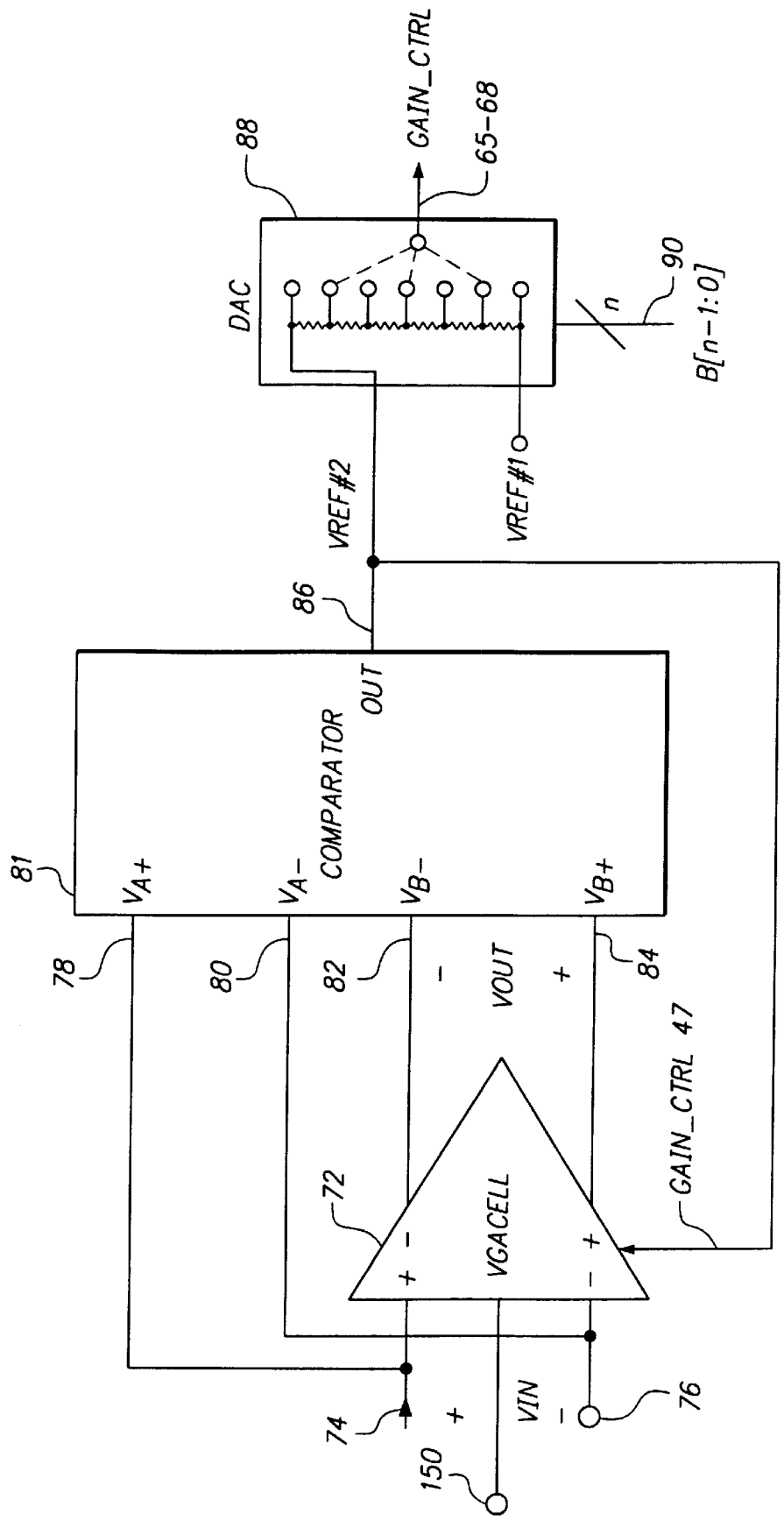
FIG. 3 is a block schematic diagram of a gain controlling circuit in accordance with one embodiment of the present invention.

Referring now to FIG. 2b there is shown an embodiment of the present invention including a plurality of cascaded stages 60–63 that form variable gain amplifier 201. Each of the stages 60–63 may include a variable-gain amplifier 200, as illustrated and described with reference to FIG. 2a. Control circuit 70 generates independent control signals for selective application to respective control ports 65, 66, 67, 68 of the stages 60–63 of the multi-stage amplifier. Each control port 65, 66, 67, 68 is coupled to gates of PFETs 50, 51, as shown in FIG. 2a, within the corresponding stage for controlling the effective resistances of the PFETs therein, and thereby independently controlling voltage gain provided by each such stage 60–63. The control circuit 70 includes for each stage 60–63 a circuit as illustrated in FIG. 3 for generating the gain-controlling signals 65–68 (or, 47 in FIG. 2a) that are selectively applied to each such gain stage 60–63 in order to adjust the overall gain of the multi-stage amplifier 201. Specifically, an approximation of exponential gain control is achieved by initially setting the voltage gains of all of the gain stages 60–63 at minimum voltage gain (for example, at 1). Then, substantially exponential gain control is achieved by first increasing the voltage gain toward maximum (for example, 2) in only one gain stage, say 60, at a time while the gains of all other gain stages 61–63 are at minimum settings. Thereafter, to achieve higher voltage gain with one gain stage set at maximum gain, the voltage gain of only one additional gain stage, say 61, is increased toward maximum, and so on for additional required gain from all of the gain stages successively and independently adjusted toward maximum gain settings. Such adjustments under control of the control circuit 70 therefore yield substantially exponential gain adjustment, with the last gain stage 63 remaining at minimum gain setting until final gain adjustment in excess of gain provided by all preceding gain stages 60–62 is required.

Referring now to FIG. 3, there is shown a block diagram of a portion of the control circuit 70 for gain stage 60–63 in the circuit illustrated in FIG. 2b. Such portion of the control circuit 70 includes a gain stage 72 which may be assembled for fabricating convenience substantially as shown and previously described with reference to FIG. 2a, with one variation in circuitry. Using the same cell structure for fabricating the PFETs 50, 51 in semiconductor processes, an additional pair of such PFETs is fabricated in parallel connection with PFETs 50, 51 to receive the same common-mode reference voltage 150 and the gain controlling signal 47. In this way, the effective resistance of each such parallel pair of PFETs is one-half the value provided by only one PFET. Therefore, for a given gain-controlling signal 47 to establish a maximum gain of 2, such same signal establishes a gain of 1 by the Equation 1 for an effective resistance reduced by a factor of 2 by the parallel-connected PFETs, as described.

Such modified gain stage forms the variable gain amplifier (VGA) cell 72 and the gain-controlling signal GAIN_CTRL applied thereto may conveniently be the reference voltage #2 that establishes maximum gain setting in such a gain stage. The common-mode reference voltage 150 is supplied, as illustrated in FIG. 2a, and differential reference voltages of, say ±100 multivolts, are supplied to the inputs 74, 76 and are also supplied to the Va+ and Va− terminals 78, 80 of comparator 81. In addition, the differential outputs of the VGA cell 72 are supplied to terminals 82, 84 of the comparator 81. This comparator 81 of conventional design compares the positive differential voltage of $(V_{A+} - V_{A-})$ at terminals 78 and 80 to the positive differential output voltage of $(V_{B+} - V_{B-})$ at terminals 84 and 82.

If $(V_{A+} - V_{A-})$ is greater than $(V_{B+} - V_{B-})$ then the computer output voltage on terminal 86 will decrease until $(V_{A+} - V_{A-})$ is equal to $(V_{B+} - V_{B-})$. Likewise if $(V_{A+} - V_{A-})$ is less than $(V_{B+} - V_{B-})$ then the computer output voltage on terminal 86 will increase until they are equal. When $(V_{A+} - V_{A-})$ is equal to $V_{B+} - V_{B-}$), comparator output voltage which also serves as the voltage reference #2, (VREF#2) that is supplied as the GAIN_CTRL signal to establish the maximum gain of 1 in VGA cell 72.

A conventional Digital to Analog Converter (DAC) 88 receives the output 86 as voltage reference #2, and also receives the voltage reference #1 (which may be ground) for producing therefrom one of the gain-controlling signal 65–68 for the associated stage 60–63 of the multi-stage amplifier, as shown in FIG. 2b, under control of applied digital signals 90. In one form of DAC 88, a voltage divider of series resistances and multiple taps may be controlled in conventional manner by applied digital signals 90 of N bits to produce a proportional GAIN_CTRL signal 60–63 having a value that is selected from within the limits of the values of the voltage references #1 and #2.

Therefore, the voltage gains of all stages 60–63 of the multi-stage amplifier, as shown in FIG. 2b, can be independently controlled by circuitry, as shown in FIG. 3, for each such gain stage 60–63 under control of associated digital control signals 90. These digital control signals 90 for each stage 60–63 may be formed in conventional manner, for example, by a digital automatic level (or volume) control circuit (not shown) that initially adjusts the gain only of the first stage 60 from its minimum to its maximum gain settings, and thereafter adjusts the gain only of the next stage 61, and so on through successive adjustments in all stages 60–63 up to maximum overall gain, as may be required.

What is claimed is:

1. A multi-stage amplifier comprising:

a plurality of controllable gain amplifiers connected in cascade to supply output signals of a preceding stage as corresponding input signals to a next succeeding stage, and a control circuit for each gain amplifier connected to supply control signal independently to each stage for selectively altering the gain of an initial stage between substantially minimum gain and maximum gain while the gain of each succeeding stage is controlled substantially at minimum gain, and thereafter selectively alters the gain of a succeeding stage between substantially minimum gain and maximum gain as the gain of the initial stage is controlled at substantially maximum gain and the gain of each remaining succeeding stage is controlled at substantially minimum gain.

2. A controllable gain amplifier comprising:

a pair of gain elements, each having a pair of electrodes forming a current-conducting channel, and an input electrode for receiving input signal applied thereto to control current conducted between the pair of electrodes, with corresponding ones of the pairs of electrodes connected in common to a current source;

a pair of elements each having resistance determined in response to control signal applied thereto, the elements being connected in common to receive supply voltage and to corresponding other of the pair of electrodes of the gain elements;

an auxiliary current source connected to each of said corresponding other of the pair of electrodes of the gain elements for producing at each such electrode an output signal representative of the input signal applied to the corresponding input electrode with a gain determined by control signal applied in common to the pair of elements; and a control circuit for supplying the control signal, the control circuit comprising:

a pair of auxiliary gain elements, each having a pair of electrodes forming a current-conducting channel, and an input electrode for receiving input signal applied thereto to control current conducted between the pair of electrodes, with corresponding ones of the pairs of electrodes connected in common to a current source;

a pair of auxiliary elements each having resistance determined in response to control signal applied thereto, the auxiliary elements being connected in common to receive supply voltage and to corresponding other of the pair of electrodes of the auxiliary gain elements;

an additional current source connected to each of said corresponding other of the pair of electrodes of the auxiliary gain elements for producing at each such electrode an output signal representative of the input signal applied to the corresponding input electrode with a gain determined by control signal applied in common to the pair of auxiliary elements;

reference voltage supplies connected to supply input signals to the input electrodes of the auxiliary gain elements;

a comparator connected to receive the reference voltages and output signals from the auxiliary gain elements for producing a comparator output as a logical combination of the output signals from the auxiliary gain elements and the reference voltages as input signals to the auxiliary gain elements for application as control signal to the auxiliary elements; and a converter connected to receive the comparator output and an auxiliary reference voltage for supplying a control signal to the pair of elements having amplitude in a range between the levels of comparator output and auxiliary reference voltage in response to a gain-controlling signal supplied to the converter for setting the gain from input signal to output signal of said gain elements.

3. The controllable gain amplifier as in claim 2, wherein the reference voltage supplies have positive and negative amplitudes $V_A$, and said output signals from the auxiliary gain elements have positive and negative amplitudes $V_B$, and the comparator produces said comparator output as the difference between the differential of the reference voltage supplies $V_A$ and the differential of output signals from the auxiliary gain elements, $V_B$.

4. The controllable gain amplifier as in claim 2, wherein said converter produces gain control signal as an analog signal having amplitude representative of a digital gain-controlling signal supplied to the converter.

5. The controllable gain amplifier as in claim 2 where in the gain elements and elements and auxiliary gain elements and auxiliary elements are fabricated as an integrated circuit, and the auxiliary gain elements and auxiliary elements of the control circuit are formed substantially identically to, respectively, the gain elements and elements of the gain amplifier.

6. The controllable gain amplifier according to claim 5 including a second pair of auxiliary elements each having resistance determined in response to control signal applied thereto, the second pair of auxiliary elements being fabricated as portions of said integrated circuit connected in parallel with said auxiliary elements in said control circuit.

7. A method of controlling amplification of applied signal by a plurality of cascaded gain stages that each has gain variable over a range between minimum and maximum levels in response to a gain-controlling signal applied thereto, the method comprising:

selectively adjusting the gain of one of the plurality of cascaded gain stages toward maximum gain with all other of the plurality of cascaded gain stages substantially at minimum gain; and selectively adjusting another of the plurality of cascaded gain stages toward maximum gain with said one gain stage substantially at maximum gain and with all remaining other of the plurality of cascaded gain stages substantially at minimum gain; and selectively adjusting one of the remaining other of the plurality of cascaded gain stages toward maximum gain with said one and said another of the plurality of cascaded gain stages substantially at maximum gains.

8. The method according to claim 7 in which said one gain stage is a preceding gain stage in the plurality of cascaded gain stages; and said another gain stage is a next succeeding gain stage in the plurality of cascaded gain stages, for selective adjustments of the gains thereof from minimum toward maximum gains in succession from an initial gain stage toward a final gain stage in the plurality of cascaded gain stages to provide substantially exponential amplification of applied signal.

9. A multi-stage controllable gain amplifier comprising:

a plurality of gain stages each controllable within a range between a minimum gain and a maximum gain and connected in cascade to supply output of a preceding stage as corresponding input to a next succeeding stage; and a control circuit connected to supply control signal independently to each gain stage for selectively altering the gain thereof in succession in an initial stage between substantially minimum gain and maximum gain while the gain of each succeeding stage is controlled substantially at minimum gain, and thereafter for selectively altering the gain of a succeeding stage between substantially minimum gain and maximum gain as the gain of the initial stage is controlled substantially at maximum gain and the gain of each remaining succeeding stage is controlled substantially at minimum gain.

10. The controllable gain amplifier as in claim 9 in which the control circuit for supplying the control signal to a gain element comprises:

an auxiliary gain stage having an input and an output and an auxiliary control input for producing an output signal representative of an applied input signal with a gain determined by control signal applied to the auxiliary control input;

a reference voltage supplied as input signal to the input of the auxiliary gain stage;

a comparator connected to receive the reference voltage and the output of the auxiliary gain stage for producing a comparator output as a logical combination of the output from the auxiliary gain stage and the reference voltage for application as control signal to the auxiliary control input; and a converter connected to receive the comparator output and an auxiliary reference voltage for supplying a control signal to a gain stage having amplitude determined in response to a gain-controlling signal supplied to the converter for setting the gain from input to output of such gain stage.

* * * * *